(12) United States Patent
Gorecki

(10) Patent No.: US 10,411,666 B2
(45) Date of Patent: *Sep. 10, 2019

(54) OPEN-LOOP LINEAR VGA

(71) Applicant: INPHI CORPORATION, Santa Clara, CA (US)

(72) Inventor: James Gorecki, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/995,008

(22) Filed: May 31, 2018

(65) Prior Publication Data
US 2018/0287577 A1   Oct. 4, 2018

Related U.S. Application Data

(63) Continuation of application No. 15/418,487, filed on Jan. 27, 2017, now Pat. No. 10,014,836.

(51) Int. Cl.
| H03F 3/45 | (2006.01) |
| H03G 1/00 | (2006.01) |
| H03F 1/56 | (2006.01) |
| H03F 1/02 | (2006.01) |
| H03G 3/00 | (2006.01) |

(52) U.S. Cl.
CPC ........... *H03G 1/007* (2013.01); *H03F 1/0205* (2013.01); *H03F 1/56* (2013.01); *H03F 3/45197* (2013.01); *H03G 3/001* (2013.01); *H03F 2203/45492* (2013.01)

(58) Field of Classification Search
CPC ............. H03F 3/45; H03F 3/191; H03F 3/193
USPC .................................................. 330/254, 305
See application file for complete search history.

(56) References Cited

U.S. PATENT DOCUMENTS

| 5,384,501 A * | 1/1995 | Koyama ................. G06G 7/184 327/336 |
| 8,493,149 B2 * | 7/2013 | Parikh .................. H03G 1/0029 330/254 |
| 2009/0261899 A1 * | 10/2009 | Gomez .................. H03G 3/001 330/2 |

* cited by examiner

*Primary Examiner* — Steven J Mottola
(74) *Attorney, Agent, or Firm* — Richard T. Ogawa; Ogawa P.C.

(57) ABSTRACT

The present invention is directed to electrical circuits. More specifically, embodiments of the present invention provide a variable gain amplifier (VGA) device that includes a low-gain tuning section and a high-gain tuning section. The low-gain tuning section includes both resistor and transistor elements. The high-gain tuning section includes a transistor element and is activated when an output gain is greater than a predetermined threshold level. There are other embodiments as well.

18 Claims, 10 Drawing Sheets

OPEN-LOOP LINEAR VGA

CROSS-REFERENCES TO RELATED APPLICATIONS

The present specification is a continuation of U.S. patent application Ser. No. 15/418,487, filed on Jan. 27, 2017 and now issued as U.S. Pat. No. 10,014,836, the entire contents of which are incorporated herein by reference.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to electrical circuits and techniques thereof.

A variable gain amplifier (VGA) has many applications. Typically, variable-gain or voltage-controlled amplifier is an electronic amplifier that varies its gain depending on a control voltage (CV). VGAs have many applications, including audio level compression, synthesizers, amplitude modulation, and others. For example, a VGA can be implemented by first creating a voltage-controlled resistor (VCR), which is used to set the amplifier gain. The VCR can be produced by one or more transistors with simple biasing. In certain implementation, VGA are implemented using operational transconductance amplifiers. Sometimes, VGAs are implemented for automatic gain control (AGC) applications. Typically, VGA performance can be measured in terms of gain range, linearity of electrical characteristics, distortion, tunabiltiy, and bandwidth.

Over the past, many types of conventional variable gain amplifiers have been proposed and implemented in different applications. Unfortunately, existing variable gain amplifiers are inadequate, as explained below. It is thus desirable to have new and improved variable gain amplifiers.

BRIEF SUMMARY OF THE INVENTION

The present invention is directed to electrical circuits. More specifically, embodiments of the present invention provide a variable gain amplifier (VGA) device that includes a low-gain tuning section and a high-gain tuning section. The low-gain tuning section includes both resistor and transistor elements. The high-gain tuning section includes a transistor element and is activated when an output gain is greater than a predetermined threshold level. There are other embodiments as well.

According to an embodiment, the present invention provides a variable gain amplifier (VGA) device. The device includes a first input transistor comprising a first terminal, a second terminal, and a third terminal. The first input transistor is configured to receive a first input voltage at the first terminal. The device also includes a second input transistor comprising a fourth terminal and a fifth terminal and a sixth terminal. The second input transistor is configured to receive a second input voltage at the fourth terminal. The device includes a first output terminal for providing a first output voltage. The device further includes a second output terminal for providing a second voltage. The device also includes a first load being coupled to the fourth terminal and the first output terminal. The device additionally includes a second load being coupled to the fifth terminal and the second output terminal. The device further includes a control module that is configured to generate a first tuning signal and a second tuning signal. The second tuning signal is at a low-gain setting if a gain setting for the VGA is lower than a first predetermined threshold value. The device further includes a first tuning section comprising a first resistor and a first tuning transistor, the first tuning transistor being coupled to the first tuning signal. The first tuning section is coupled to the third terminal and the sixth terminal. The device also includes a second tuning section comprising a second tuning transistor. The second tuning section is coupled to the second tuning signal. The second tuning section is coupled to the third terminal and the sixth terminal.

According to another embodiment, the present invention provides a method for operating a variable-gain amplifier. The method includes receiving an input gain signal. The device includes determining a first gain control value. The method also includes determining a second gain control value, which is at a high-gain setting if the input gain signal is greater than a threshold level. The method also includes generating a first gain control signal based on the first gain control value. The method further includes generating a second gain control signal based on the second gain control value. The method includes receiving a first input signal and a second input signal. The method also includes providing a first tuning section including a first transistor and a first resistor. The method additionally includes providing a second tuning section including a second transistor. The method includes adjusting a first impedance value of the first tuning section using the first gain control signal. The method further includes adjusting a second impedance value of the second tuning section using the second gain control signal. The method additionally includes providing a first output signal, which is characterized by a gain level associated with the input gain signal. The first output signal is based at least on the first impedance value and the second impedance value.

According to yet another embodiment, the present invention provides an electrical system for adjusting signal gain. The system includes an amplifier section that has a first input transistor comprising a first terminal and a second terminal and a third terminal. The first input transistor is configured to receive a first input voltage at the first terminal. The amplifier section includes a second input transistor comprising a fourth terminal and a fifth terminal and a sixth terminal. The second input transistor is configured to receive a second input voltage at the fourth terminal. The amplifier section includes a first output terminal for providing a first output voltage. The amplifier section has a second output terminal for providing a second voltage. The amplifier section also includes a first load being coupled to the fourth terminal and the first output terminal. The amplifier section further includes a second load being coupled to the fifth terminal and the second output terminal. The amplifier section also includes a control module being configured to generate a first tuning signal and a second tuning signal. The second tuning signal is at a low-gain setting if a gain setting for the VGA is lower than a first predetermined threshold value. The amplifier section has a first tuning section comprising a first resistor and a first tuning transistor. The first tuning transistor is coupled to the first tuning signal, the first tuning section being coupled to the third terminal and the sixth terminal. The system further includes a control module being configured to generate the first tuning signal and the second tuning signal, the second tuning signal being inactive if a gain setting for the VGA is lower than a predetermined threshold value.

It is to be appreciated that embodiments of the present invention provide many advantages over conventional techniques. Among other things, by using multiple tuning sections, a high degree of linearity and tenability can be obtained with minimal distortion. Depending on the implementation, tuning sections can be flexibility added or removed to maximize performance of VGA devices.

Embodiments of the present invention can be implemented in conjunction with existing systems and processes. For example, variable gain amplifiers according to embodiments of the present invention can be used in lieu of conventional VGAs in many applications. Additionally, VGAs according to embodiments of the present invention can be manufactured using existing manufacturing techniques, processes, and equipment. There are many other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits. More specifically, embodiments of the present invention provide a variable gain amplifier (VGA) device that includes a low-gain tuning section and a high-gain tuning section. The low-gain tuning section includes both resistor and transistor elements. The high-gain tuning section includes a transistor element and is activated when an output gain is greater than a predetermined threshold level. There are other embodiments as well.

Figure 1:
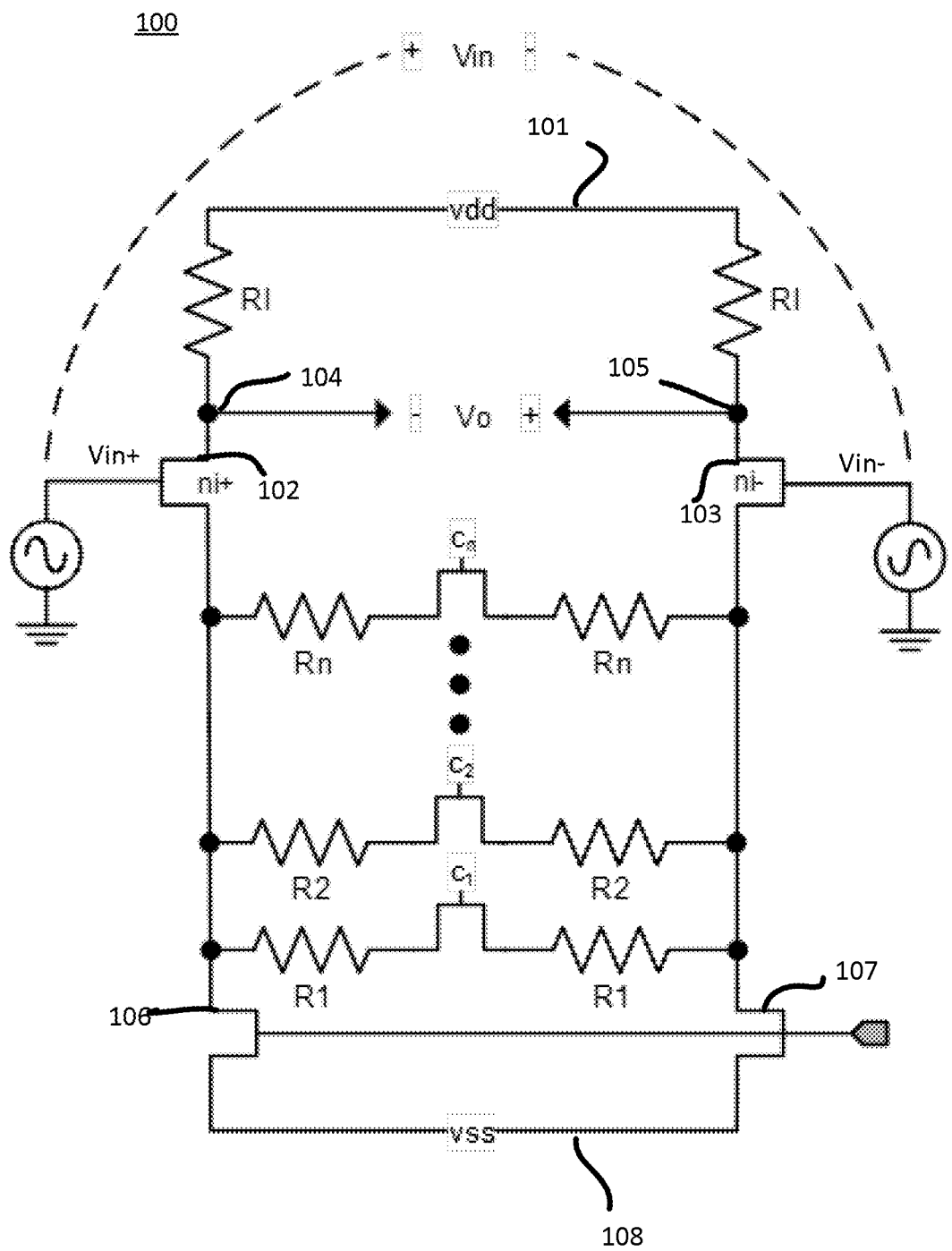
FIG. 1 is a simplified diagram illustrating a conventional open loop VGA 100.

As explained above, VGA devices have a wide range of applications. Over the past, various VGA designs have been proposed. For example, FIG. 1 is a simplified diagram illustrating a conventional open loop VGA 100. A pair of differential input Vin+ and Vin− is respectively coupled to transistor 102 and transistor 103 as shown. Each of the transistors (102 and 13) is characterized by its own transconductance (Gm) value. More specifically, with input voltages as inputs received by transistor 102 and transistor 103, these two transistors effectively function as current sources whose amount of current is based on both input voltage and transistor characteristics.

The output voltages at nodes 104 and 105 (respectively for negative and positive output voltages) are based on the voltage distribution between the load resistors $R_L$ and resistor array controlled by switches (i.e., switches $C_1$ to $C_n$). For example, by opening switch $c_2$, the two $R_2$ resistors are functionally removed from the device. The load resistors are configured between supply voltages Vdd 101 and Vss 108. The VGA 100 further includes transistors 106 and 107 that provide the bias. To change the output voltage and thus adjust the gain of VGA 100, switches at resistor arrays are selectively turned on or off. For example, in relation to the output terminals, the resistor array can be viewed collectively to have a value of $R_x$. Since there are a discrete and preconfigured number of resistors, the possible $R_x$ value of the resistor array is discrete and predetermined.

The low-frequency gain of VGA can be described in Equation 1 below:

$$\frac{V_O}{V_I} = GmR_L \frac{2}{(2 + GmR_X)} \qquad \text{Equation 1}$$

In Equation 1, $V_o$ is the output voltage and $V_i$ is the input voltage. The variable Gm, as explained above, is the transconductance value of transistor 102 and/or transistor 105. The variable $R_L$ is the value of load resistors. The variable $R_X$ is the effective resistance value of the resistors array.

There are various drawbacks and disadvantages regarding the design of VGA 100 illustrated in FIG. 1. Among other things, since adjustment of gain depends on the resistor array that has a discrete number of switches and their corresponding resistors, the resistance value $R_x$ (and thus VGA gain) can only be adjusted in a limited and discrete number of ways. Additionally, resistors typically take up valuable real estate on circuit chips, and thus are expensive to implement (especially when there are a large number of resistors).

Figure 2:
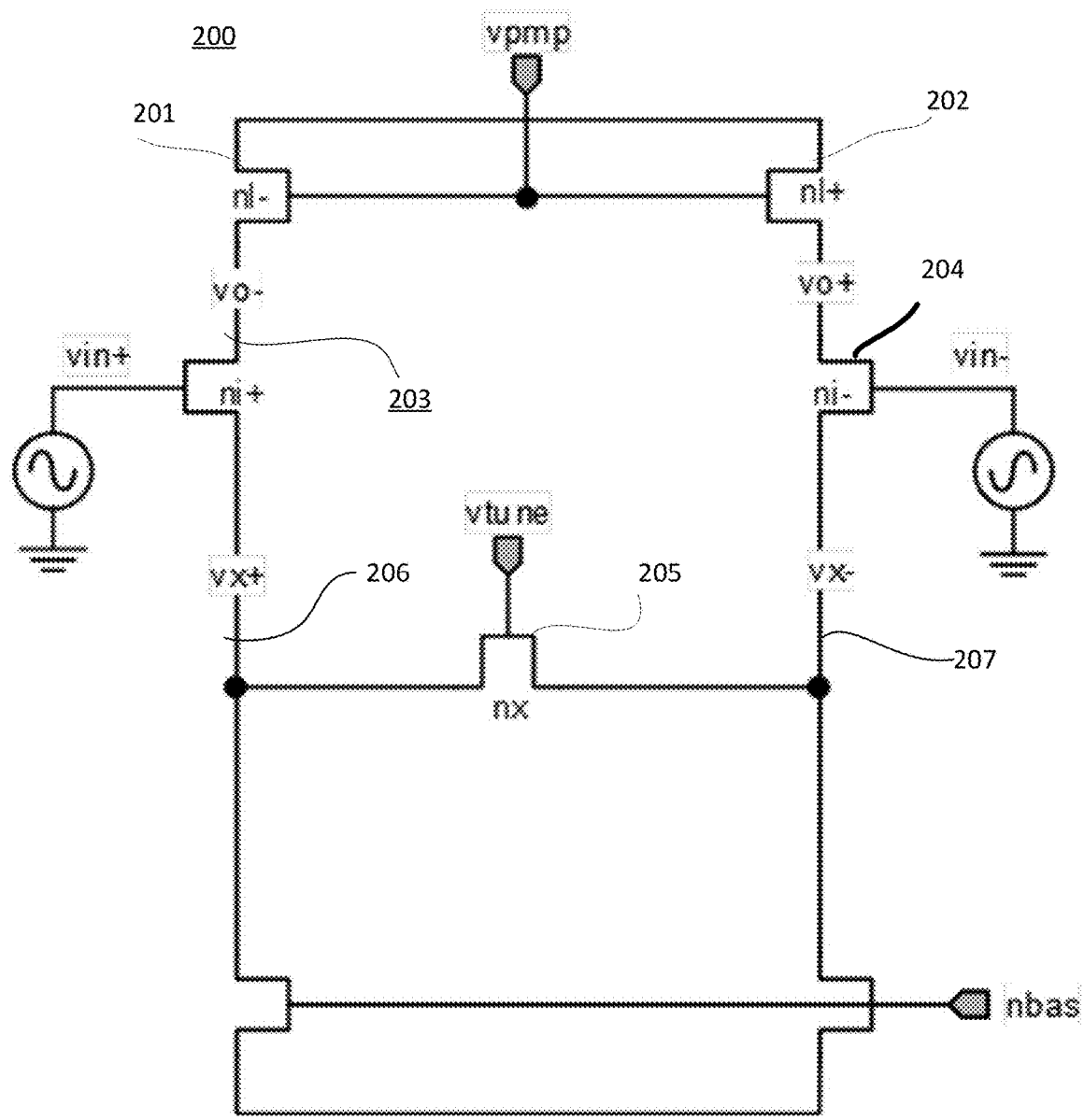
FIG. 2 is a simplified diagram illustrating a transistor based VGA device 200.

In certain applications, resistors are implemented using transistors (or voltage controlled resistors) instead of resistors. FIG. 2 is a simplified diagram illustrating a transistor based VGA device 200. As shown in FIG. 2, transistor 205 replaces the resistor array in FIG. 1. Among other features, transistor 205 functions as a VCR and receives a control voltage $v_{tune}$ that adjusts the equivalent resistance value of transistor 205. It is to be appreciated that control voltage $v_{tune}$ applied to transistor 205 can be fine-tuned and is continuously adjustable (i.e., not limited by the number of switches and resistors in FIG. 1). The gain of VGA 200 can be expressed by Equation 1 explained above, where the term "$R_X$" is replaced by the resistance value of transistor 205. It is to be noted that that in FIG. 2, transistor 201 and transistor 202 (coupled to pump voltage $v_{pump}$) are used instead of load resistors $R_l$, and these transistors are functionally equivalents of the load resistors. Referring back to Equation 1, the resistance value $R_L$ is replaced by the term ($1/Gm_{load}$), where $Gm_{load}$ is the transconductance value of the load transistors 201 and 202.

There are many advantages offered by using transistor 205. Unfortunately, there are also drawbacks associated using transistor 205. Among other things, transistor 205 can be non-linear and may have a high level of total harmonic distortion (THD) under certain operating parameters. For example, transistor 205 is implemented using a CMOS device, which can introduce distortion of THD at low gain settings.

Distortion of VGA 200 in FIG. 2 can be explained by equations below. Assuming that input transconductances (Gm) of transistors 203 and 204 are high, the small signal values at node 206 and node 207 can be expressed by the following equations:

$$vx+ \cong vi+ \qquad \text{Equation 2A}$$

$$vx- \cong vi- \qquad \text{Equation 2B}$$

As shown in FIG. 2, voltage across transistor 205 is the voltage between nodes 206 and 207 (i.e., between vx+ and vx−).

The distortion of VGA 200 ($THD_1$) can be expressed by equations below:

$$I = K(V^* Vin - Vin^2/n) \qquad \text{Equation 3}$$

where: "I" is the drain source current of transistor 205;
"V*" is the tuning voltage "vtune" applied to the gate of transistor 205 in light of defined as $V^* = vtune - (vx_+ + vx_-)/2 - Vt$;
"Vin" is the input voltage (i.e., Vin+ and/or Vin−); and
"n" is the slope factor.

$$Vin = A \cos(\omega t) \qquad \text{Equation 4}$$

where: "A" is the input sinusoidal amplitude $$I = AKV^* \cos(\omega t) - \frac{KA^2}{2n} - \frac{KA^2}{2n} \cos(2\omega t) \qquad \text{Equation 5}$$

where: "K" is the transistor gain $$THD_1 = \frac{A}{2nV^*} \qquad \text{Equation 6}$$

Based on Equation 6, it can be seen that distortion $THD_1$ is proportional to "A" and inversely proportional to "V*". This implies that small V* leads to high distortion, or when the VGA gain is low (e.g., 0 dB or even lower). For example, operating at low gain settings, VGA 200 in FIG. 2 may have a higher level of THD than that of the VGA 100. On the other hand, when the tuning voltage V* is high, THD is low. Thus, for operating at high gain settings when V* is high and effective resistance of transistor 205 is low, THD for VGA 200 is low.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 3:
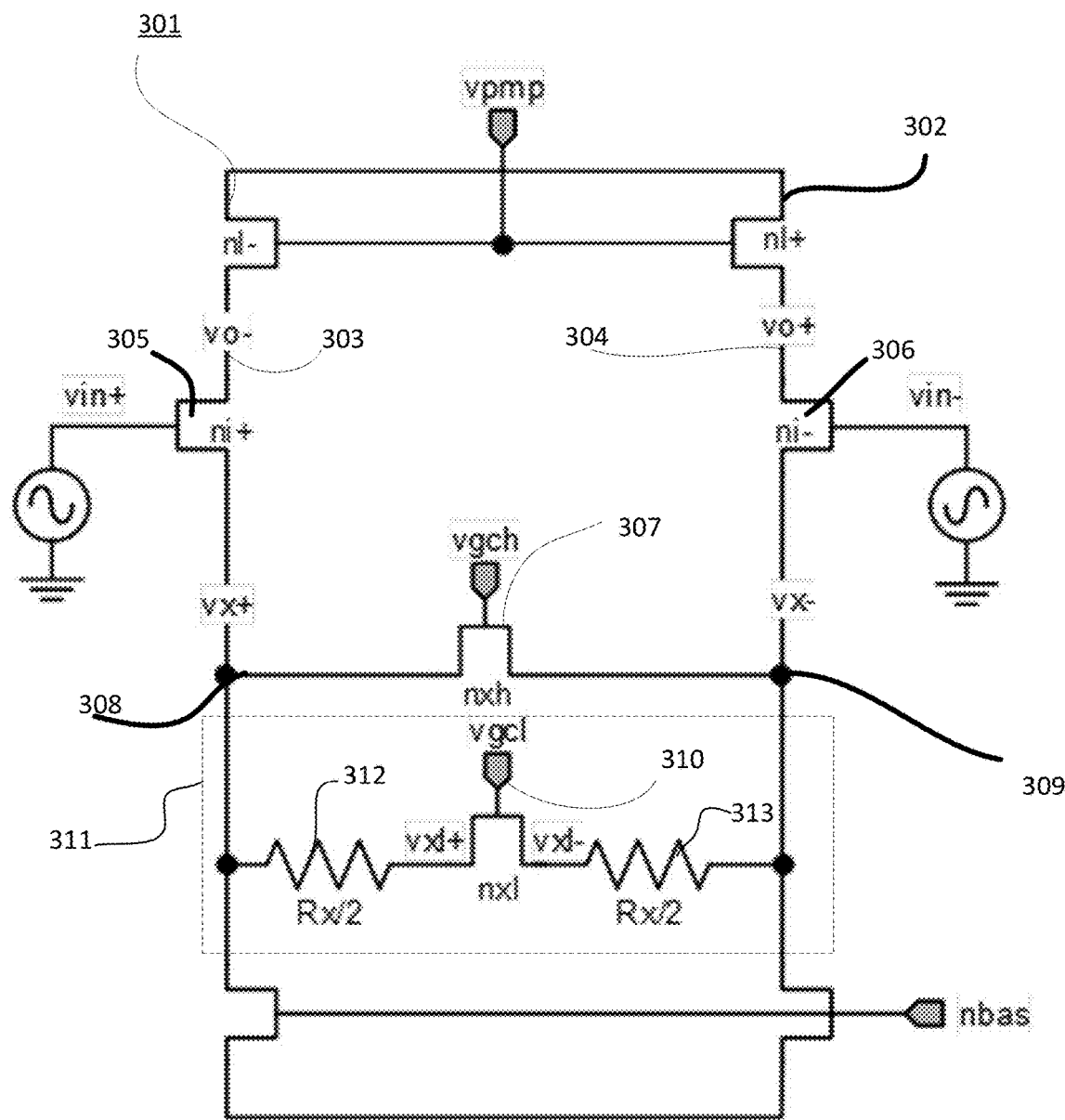
FIG. 3 is a simplified diagram illustrating an open loop linear VGA 300 according to an embodiment of the present invention.

It is to be appreciated embodiments of the present invention provides linear VGA devices that operate provide linearity, tunability, and low distortion. FIG. 3 is a simplified diagram illustrating an open loop linear VGA 300 according to an embodiment of the present invention. This diagram is merely an example, which should not unduly limit the scope of the claims. One of ordinary skill in the art would recognize many variations, alternatives, and modifications. A linear VGA device 300 includes a switched resistor section and a transistor 307 for adjusting the gain (i.e., ratio between output voltage and input voltage). Input voltages $v_{in+}$ and $v_{in-}$ are connected to the gate terminals of transistors 305 and 306 respectively. For example, transistors 305 and 306 are implemented using CMOS transistors. Transistors 305 and 306 are characterized by their transconductance values, and effectively transistors 305 and 306 provide currents that are based on the input voltages.

The outputs of VGA 300 are provided at node 303 and 304. More specifically, node 303 provides negative output $v_{o+}$ and node 304 provides positive output $v_{o-}$. As mentioned above, output voltages of VGA 300 depend on both the load section and the tuning section (i.e., resistor section 311 and a transistor 307). For example, transistors 301 and 302 are implemented as the output load section. It to be appreciated that the load section can be implemented using other electrical components as well, such as load resistors shown in FIG. 1. Additionally, the load section can be implemented as combination of resistors and transistors.

Transistors 305 and 306 are coupled to the resistor section 311 and transistor 307. Transistor 307 is configured between nodes 308 and 309. For example, transistor 307 comprises a CMOS transistor and functions a variable impedance element (or voltage-controlled resistor) whose impedance value is controlled by the control signal $v_{gch}$ that is coupled to the gate of transistor 307. The resistor section 311 is provided in a parallel configuration in relation to transistor 307, as the switched resistor section is also coupled to nodes 308 and 309 as shown. Transistor 310 is configured between two resistors that each has a resistance of Rx/2 (i.e., thus a total resistance of Rx, as the two resistors are configured in series in relation to each other). Depending on the implementation, transistor 310 can function as a switch (i.e., being either on or off as illustrated in FIG. 1) or a tunable transistor (i.e., function the same as transistor 307). For example, functioning as a switch, the control signal $v_{gcl}$ provides a binary control as whether transistor 310 is on or off. Functioning as a tunable transistor with its equivalent impedance value, the control signal $v_{gcl}$ provides a tuning voltage that adjusts the impedance value of transistor 310.

In various implementations, tuning section 311 and transistors 307 together provide a continuously tunable resistance. For example, transistor 310 of the tuning section 311 is turned on and continuously changes its resistance value (controlled by the tuning signal $v_{gcl}$) when operating at a low-gain setting. When VGA 300 changes from the low-gain setting to a high-gain setting, where the low-gain setting and the high-gain setting are separated by a predetermined threshold value, transistor 307 is activated and adjusts its resistance in response to the tuning signal $v_{gch}$. It is to be noted that when operating at high-gain setting, transistor 310 stays on, thereby allowing the gain of VGA 300 to be linear even during the transition from low gain to high gain.

The $V_{DS}$ voltage across the device (A'), for VGA 300, is no longer approximately equal to the input voltage (as in VGA 200 in FIG. 2). Additionally, the transistor 307 operates with a higher tuning voltage (than transistor 205 of VGA 200), as the required device resistance is reduced by a factor of "Rx" from tuning section 311. And it is to be appreciated that both effects reduce the distortion. Performance of VGA 300 can be expressed using the following equations:

$$A' \neq Vin \quad \text{Equation 7A}$$

$$A' = \frac{AR'_{sw}}{2Rx + R'_{sw}} \quad \text{Equation 7B}$$

where: "A" is the input sinusoidal amplitude;
"A'" is the $V_{DS}$ voltage across the device;
"Vin" is the input voltage;
"$R'_{sw}$" is the resistance value of the switch transistor; and
"Rx" is the series resistance of the turning section 311.

$$A' \approx \frac{A}{2RxK'V' + 1}; \quad \text{Equation 8}$$

where: "K'" is the transistor gain; and
"V'" is the effective tuning voltage of VGA 300 defined as V'=vgcl−(vx$_+$+vx$_-$)/2, and V' for VGA 300 is higher than V* for VGA 200.

$$THD_2 = \frac{A}{4nRxK'V'^2} \quad \text{Equation 9}$$

where: "$THD_2$" is the total harmonic distortion of VGA 300.

By comparing Equation 9 and Equation 6, it can be seen that $THD_2$ is lower than $THD_1$ by a factor of $2R_xK'V'$. For example, as far as THD is concerned, VGA 300 provides an improvement over VGA 200 expressed by Equation 10 below:

$$\frac{THD_2}{THD_1} = \frac{[V^*/V']}{RK'V'} \quad \text{Equation 10}$$

It is to be appreciated that improvement described in Equation 10 has been tested in actual implementations. For example, when operating at 0 dB gain, THD performance improved from VGA 200 architecture at −33 dB to VGA 300 architecture at −55 dB. The THD at 9 dB gain stays at over −50 dB for VGA 300. Therefore by using transistor 307 high gain operation and tuning section 311 for low gain operation as illustrated in FIG. 3, distortion can be effectively reduced.

Figure 4:
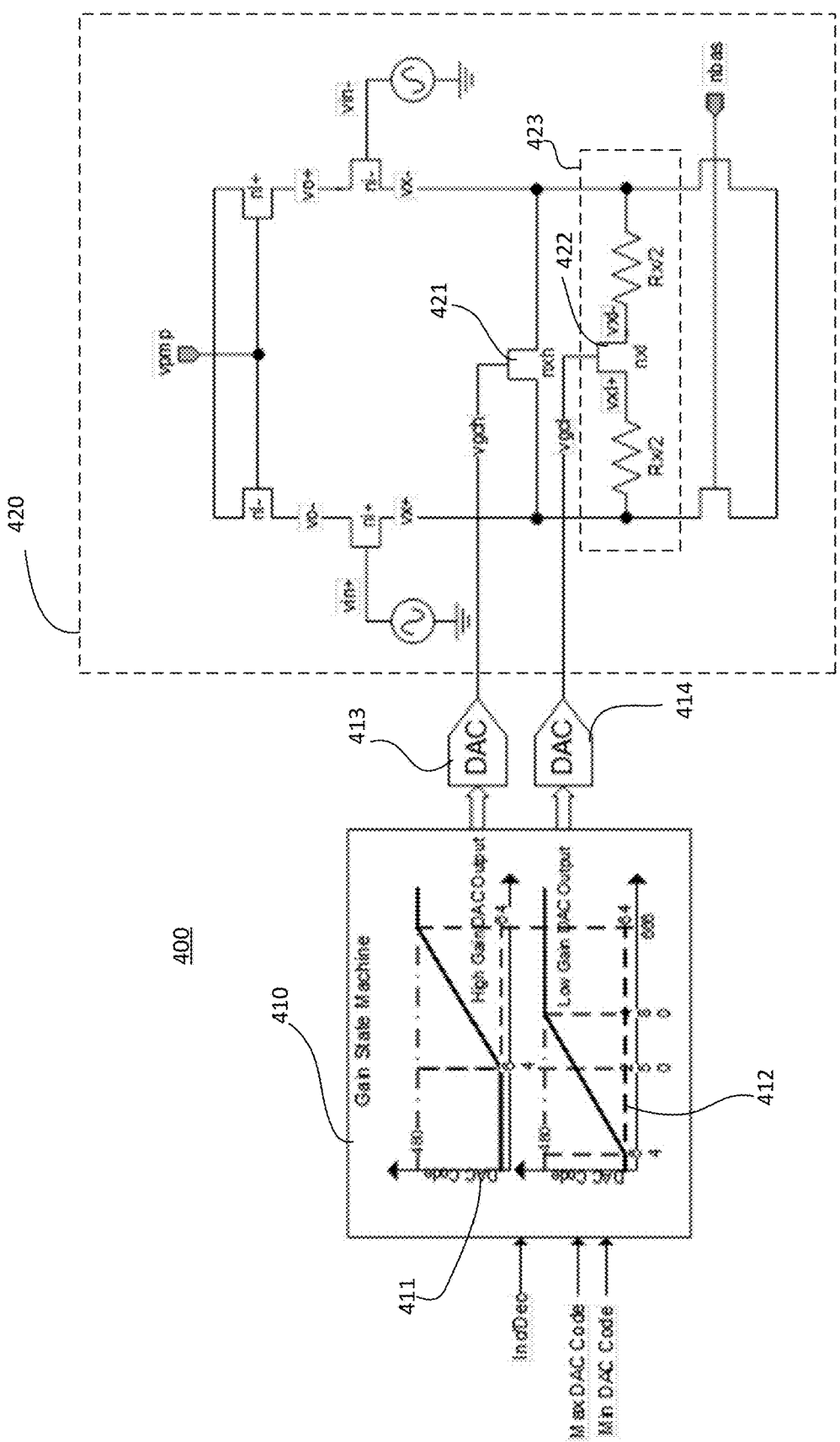
FIG. 4 is as simplified diagram illustrating a VGA system 400 according to an embodiment of the present invention.

FIG. 4 is as simplified diagram illustrating a VGA system 400 according to an embodiment of the present invention. This diagram is merely an example, which should not unduly limit the scope of the claims. One of ordinary skill in the art would recognize many variations, alternatives, and modifications. System 400 includes a control module 410 that provides digital control signals in the form of DAC codes for DAC 413 and DAC 414, which provide analog control signals for the amplifier section 420 of the VGA 400. More specifically, DAC 413 provides analog control sign "$v_{gch}$" for transistor 421. DAC 414 provides analog control signal "$v_{gcl}$" for tuning section 423, and the control signal is coupled to the gate of transistor 422.

Figure 5:
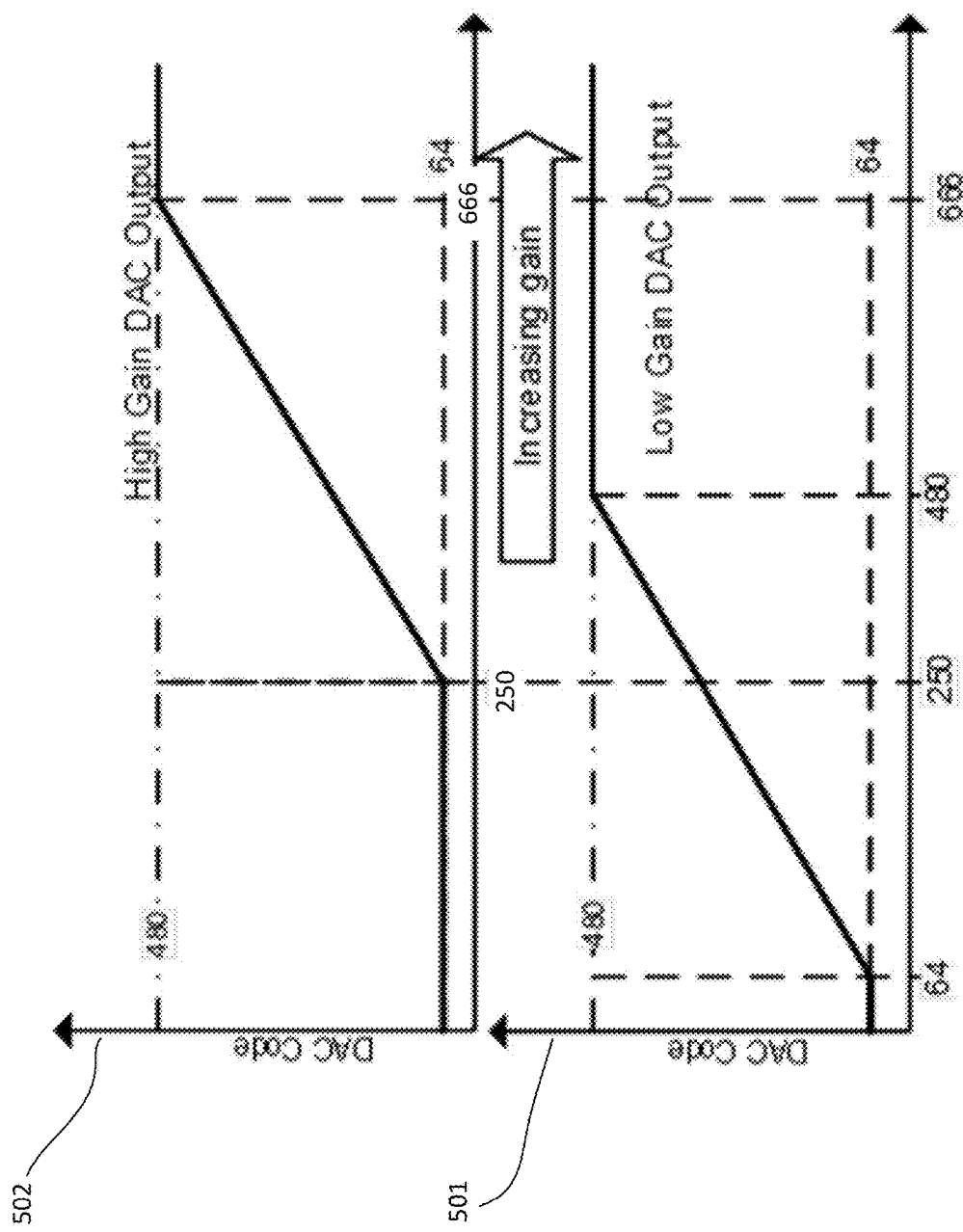
FIG. 5 is a simplified diagram illustrating operation of the control module 410 in FIG. 4.

Control module 410 receives "IncDec" signal as an input signal that for increasing or decreasing amplification, using which the control module 410 generates DAC codes for DAC 413 and DAC 414. Control module 410 comprises a state machine that provide digital code words for DAC 413 and DAC 414. In various embodiments, DAC 413 and DAC 414 are high resolution DACs (e.g., 9-bit DACs) that processes 9-bit digital code words from control module 410. Control module generates digital code words using predetermined logic and parameters. For example, minimum and maximum DAC codes are preconfigured and calibrated against the operating parameters of the amplifier section 420 of the VGA 400. An exemplary behavior of control module 410 is illustrated in FIG. 5. Among other things, control module 410 comprises digital logic that indicates at least (1) conditions for DAC 413 and 414 to be turned on; (2) correlation between output gain of VGA 400 and DAC codes; and (3) maximum and minimum output voltages (or control voltages applied to transistors 421 and 422). For example, when operating at a low gain regime (i.e., the gain being lower than a predetermined threshold), control module 410 provides DAC code only to DAC 414, as DAC 413 is off. When a predetermined output gain threshold is reached, control module 410 provides DAC codes to both DAC 413 and DAC 414.

FIG. 5 is a simplified diagram illustrating operation of the control module 410 in FIG. 4. This diagram is merely an example, which should not unduly limit the scope of the claims. One of ordinary skill in the art would recognize many variations, alternatives, and modifications. Plot 502 describes the DAC code that control module generates for DAC 413, which in turn provides analog control signal for transistor 421. Plot 501 describes the DAC code that control module generates for DAC 414, which in turn provides analog control signal for transistor 422, which functions as a voltage-controlled resistor. For example, DAC 413 and DAC 414 in FIG. 4 are sigma delta DAC devices that operates at a DAC code of 64 or above (e.g., accounting for aliasing effects).

As shown in plot 501, DAC code starts increasing from its minimum value of 64 (DAC code on vertical axis) when the output gain is set at 64. The DAC code peaks out at a value of 480 when output gain reaches 480, and the DAC code stays 480 even when output gain is at 666 as shown. This translates to turning on transistor 422 at the lowest output setting and keep increasing the control signal "$v_{gcl}$" until the control signal for transistor 422 is maxed out at the output gain setting of 480. The DAC code output (and thus the control signal "$v_{gcl}$") is substantially linear between output gain setting 63 and 480, which means that the change in resistance value of tune section 423 is substantially linear.

For high-gain operations, transistor 421 (functioning as a voltage-controlled resistor) is turned on and adjusted according to desired output setting. The DAC code value for transistor 421 is illustrated in plot 502. The DAC code stays at its minimum value of 64 until the output gain on the horizontal axis is 250. The DAC code starts increasing from the minimum value of 64 at gain setting of 250 to a maximum value of 480 (when the output gain is at 666). For example, plot 502 translates to turning transistor 421 when output gain is at 250. As output gain increase from 250 all the way to 666, the DAC code for DAC 413 linearly increases until the maximum is reached. It is to be noted that when the DAC code for DAC 413 starts ramping up at output gain of 250, the DAC code for DAC 412 (in plot 501) is also increasing. More specifically, when output gain moves from 250 to 480, DAC codes for both DAC 413 and DAC 414 increase, which means that transistors 421 and 422 are both receiving increasing control voltages at their respective gates. Transistor 422 receives its maximum control voltage when output gain reaches 480. Transistor 421 receives its maximum control voltage when the output gain reaches 666 as suggested in plot 502.

When reducing the VGA gain, the output of DAC codes to DAC 413 and DAC 414 similarly follow plots 501 and 502 (this time from right to left). For example, as the output gain decreases from the maxim gain, the DAC code for DAC 413 keeps decreasing until the gain is at 250, where the DAC code stays at its minimum value of 64; during the same time, the DAC code for DAC 414 stays at its maxim value, and when gain drops to 480, the DAC code starts decreasing linearly.

Now referring back to FIG. 4. As can be seen in FIG. 4, the state machine of control module 410 and the DACs 413 and 414 are implemented in combination to provide control signals $v_{gch}$ and $v_{gcl}$ that are respectively used to control the high-gain transistor 421 and the low gain transistor 422. It is to be understood that according to various embodiments, as described below, control signals (in certain case more than two) can be generated in other ways as well. For example, an integrated control unit may generate multiple analog control signals to adjust resistances of transistors and tuning sections (e.g., resistors with an "on/off" switch or resistors with a transistor that functions as a voltage-controlled resistor).

According to embodiments of the present invention, distortion can be minimized and optimized by appropriate adjustment of the upper and lower threshold voltages (e.g., in providing plots 501 and 502 that describes the behavior of high and low control signals) determined from simulation and/or measurement of VGA devices. In a specific embodiment, the VGA system 400 includes digitally programmable gain thresholds. For example, the DAC (e.g., DACs 413 and 414) can be implemented using simple second order sigma delta DACs with passive filters. Depending on the implementation, other types of DACs may be used as well. For example, various types of analog circuits provide overlapping control voltages described above.

Figure 6:
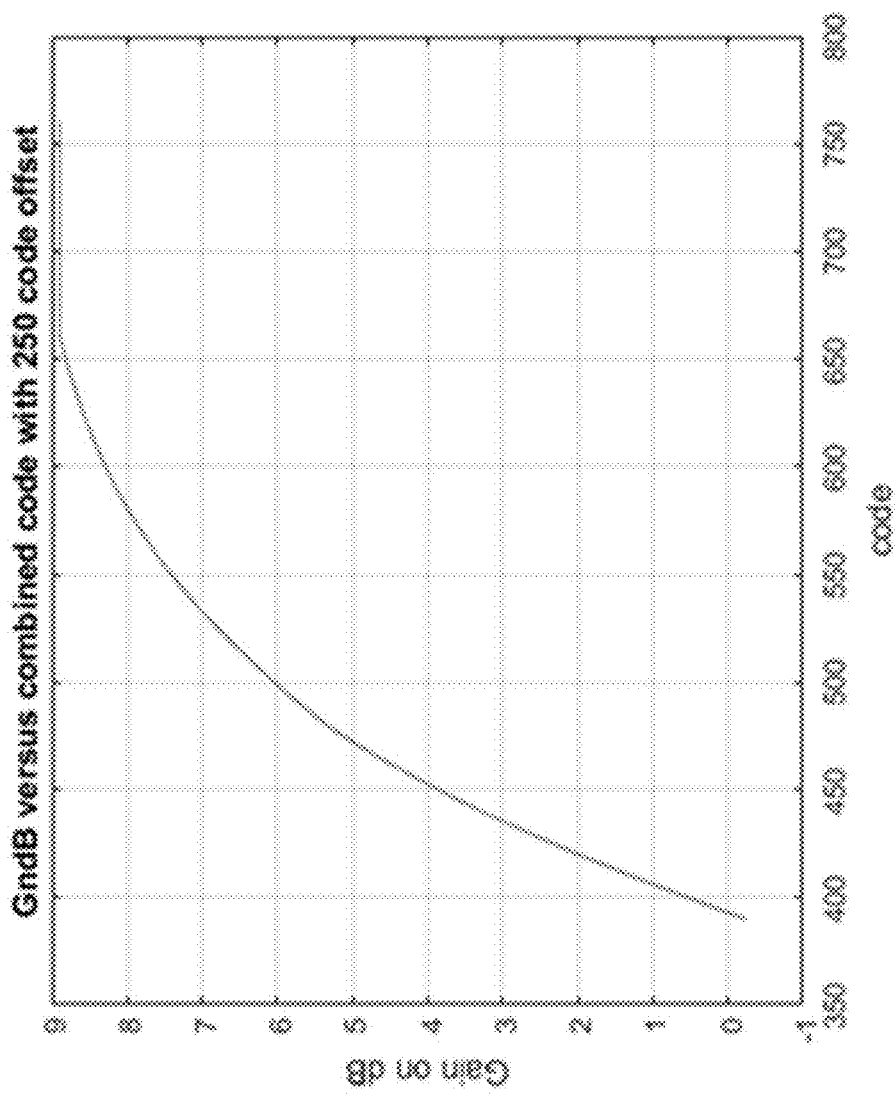
FIG. 6 is a graph illustrating a relationship between VGA gain and DAC code for VGA 400.

It is to be appreciated that VGA devices and techniques according to embodiments of the present invention can provide a high degree of linearity and tenability. FIG. 6 is a graph illustrating a relationship between VGA gain and DAC code for VGA 400. For the purpose of illustration, the DAC code on the horizontal axis is the combined DAC code with a 250 code offset, and the gain on the vertical axis is the VGA gain in decibel. As can be seen in FIG. 6, the relationship between the combined DAC code and the VGA is substantially linear and continuous.

Figure 7:
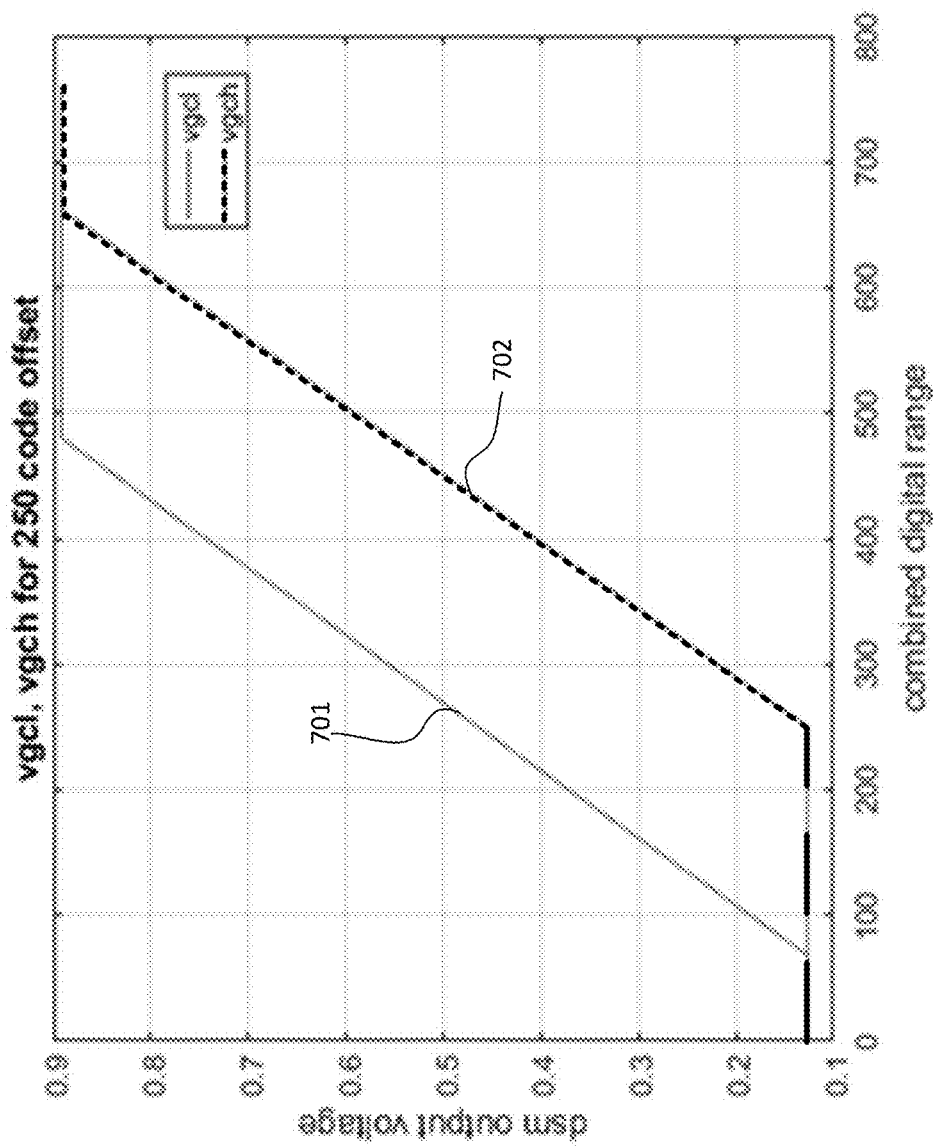
FIG. 7 is a graph illustrating combined gain digital code range and corresponding control signals generated by DACs for VGA 400.

FIG. 7 is a graph illustrating combined gain digital code range and control signals generated by DACs for VGA 400. Plot line 701 is associated $v_{gcl}$ control signal for low gain transistor 422. Plot line 702 is associated with $v_{gch}$ high-gain control signal 421. The combined digital range on the horizontal axis correlates to control signals for transistors 421 and 422. For example, threshold values (i.e., 64 and 250) for low-gain transistor 422 and high-gain transistor 421 are in accordance with plot 501 and plot 502 in FIG. 5.

Figure 8:
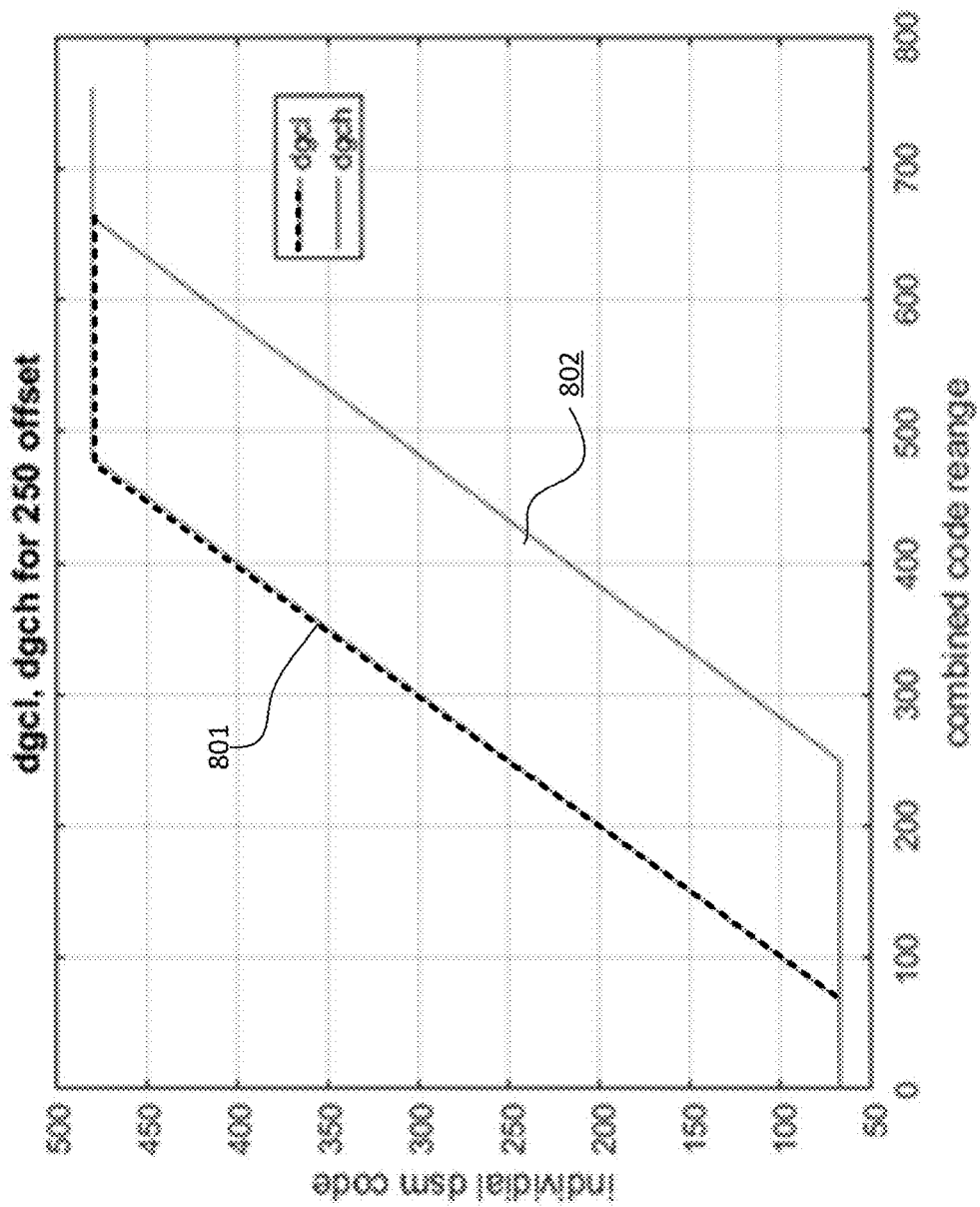
FIG. 8 is a graph illustrating combined gain digital code range and corresponding DSM codes for VGA 400.

FIG. 8 is a graph illustrating combined gain digital code range and corresponding DSM codes for VGA 400. Plot line 801 is associated DSM code for DAC 414. Plot line 802 is associated with DSM code for DAC 413. For example, threshold values (i.e., 64 and 250) for DACs 414 and 413 are in accordance with plot 501 and plot 502 in FIG. 5.

Figure 9:
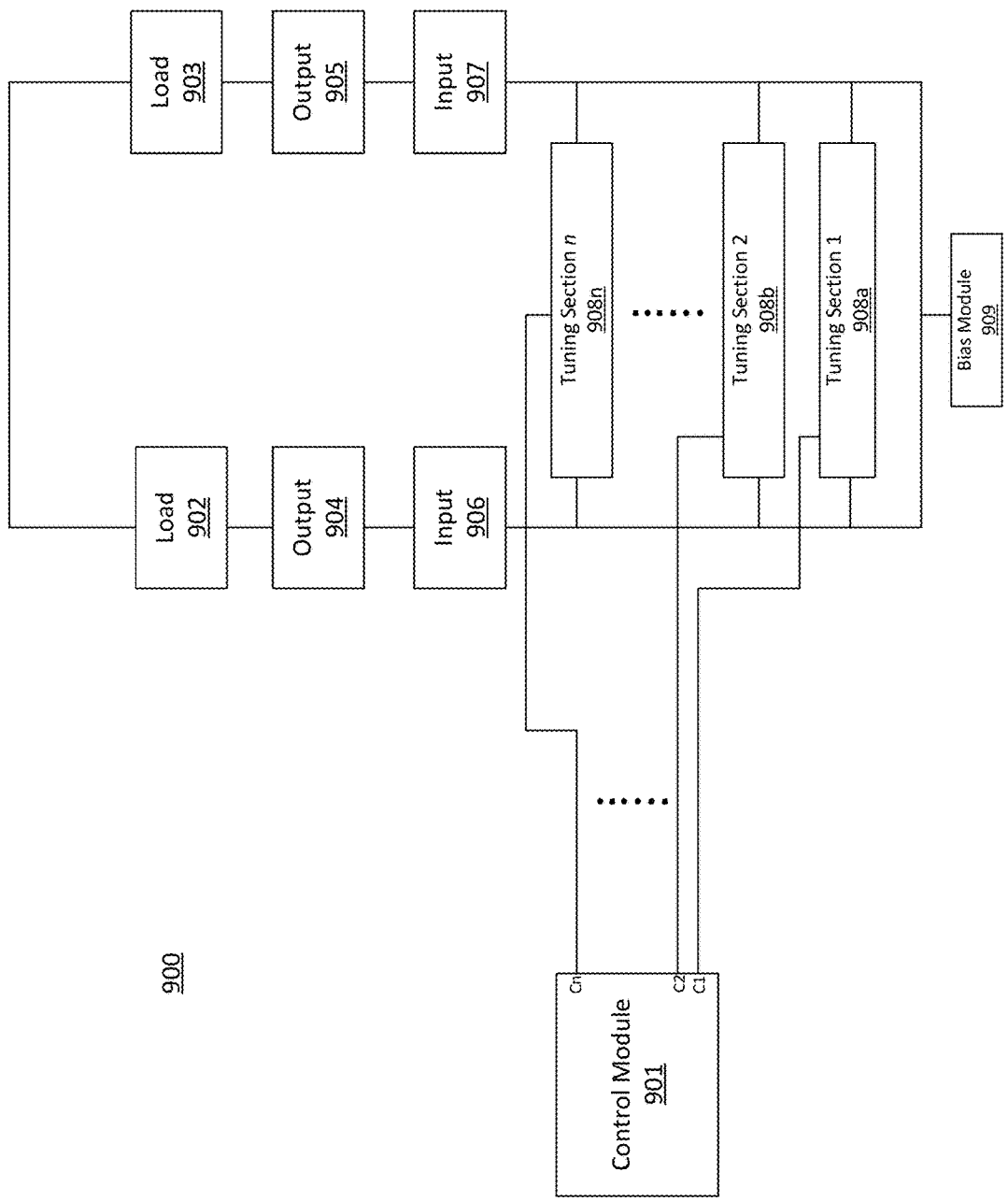
FIG. 9 is a simplified block diagram illustrating VGA system 900 according to embodiments of the present invention.

FIG. 9 is a simplified block diagram illustrating VGA system 900 according to embodiments of the present invention. This diagram is merely an example, which should not unduly limit the scope of the claims. One of ordinary skill in the art would recognize many variations, alternatives, and modifications. As explained above, VGA 300 and VGA 400 are exemplary implementations, and embodiments of the present invention can be implemented in other ways. As shown in FIG. 9, VGA system 900 includes a control module 901. Depending on the implementation, control module 901 may receive input gain signal(s) in various forms. For example, the gain signal may be an analog signal from another electrical or logic component to indicate an increase or decrease the output gain of VGA system 900. The input gain signal can also be a digital signal that indicates a target output gain as a numerical value. Additionally, control module 901 comprises a logic unit for generating control signals. For example, the logic unit for generating control signals can be a state machine as illustrated in FIG. 4, but other implementation can be used, such as microprocessor based control and others. Among other thing, the logic unit provides settings as which tuning section(s) are to be turned on and what are the strength of the control signals, which in turn adjust the impedance value of the respective tuning sections.

The ranges of impedance values of the tuning sections (e.g., 908a to 908n) are predetermined and programmed into the logic unit. As an example, the logic unit of the control module indicates that for a gain range of 0 dB to 5 dB, control signal C1 is active, and at gain range of 5 dB to 10 dB, control signals C1 and C2 are both active, and so on. For example, for n tuning sections, control module 901 provides a least n control signals. The impedance values of impedance of tuning sections, depending on the implementation, may be continuous and/or or binary. For a tuning section (e.g., implemented with transistor 421) that includes only tunable transistor that functions as a variable resistor, the impedance value is continuously tunable. Similarly, for a tuning section with resistors and a tunable transistor (e.g., tuning section 422), the impedance value is continuously tunable, with a minimum resistance value provided by the resistors. Binary tuning sections similar to the ones shown in FIG. 1 can be utilized as well, where the a switch receives control signal to indicate the tuning section is switch on or off.

In providing control signals for the tuning sections, control module 901 can be implemented in various ways. For example, control module 901 may provide individual control signals for adjusting and/or switching transistors of the tuning sections. For example, control module 901 may provide different control codes and/or control signals for the tuning sections. In a specific embodiment, control module 901 uses a single control code to adjust tuning sections, where the most significant bit (MSB) is used to switch one or more tuning sections, and least significant bits (LSBs) are used to continuously adjust the impedance value of one or more transistors.

There can be different numbers of tuning sections. At explained above, the tuning sections would include at least a low-gain section (with actual resistor elements) and a high-gain section. Additional tuning sections may be configured to provide a higher level of linearity. For example, tuning sections may be specific tuned for a high level of linearity and tenability (e.g., making gain curve shown in FIG. 5 straighter). At the same time, large number of tuning sections may lead to overly complex circuitry and control.

Amplifier section 910 of VGA 900 comprises input terminals 906 and 907. For example, input terminals 906 and 907 are configured to receive a pair of differential input that includes a positive input Vin+ and negative input Vin−. Amplifier section 910 also includes load 902 and load 903. In various embodiments, load 902 and load 903 are implemented with matched impedance values. For example, load 902 and load 903 can be implemented using transistors and/or resistors.

In various implementations, input terminals 906 and 907 are implemented using transistors (e.g., CMOS devices, etc.). For example, input terminals function as current sources and the output gain at output terminals 904 and/or 905 depends on the transconductance characteristics of the input transistors. Various types of transistors may be used for the input terminals.

Output terminal 904 is positioned between load 902 and input terminal 906. Output terminal 905 is posited between load 903 and input 907. For example, output terminals are a pair that includes positive output Vout+ and negative output Vout−. Additional electrical components may be used to implement the output terminals as well.

The amplifier section 910 also include a bias module 909 as shown. For example, the bias module may include bias transistors (e.g., bias transistors 106 and 107 shown in FIG. 1) and a voltage source (e.g., Vss 108).

Figure 10:
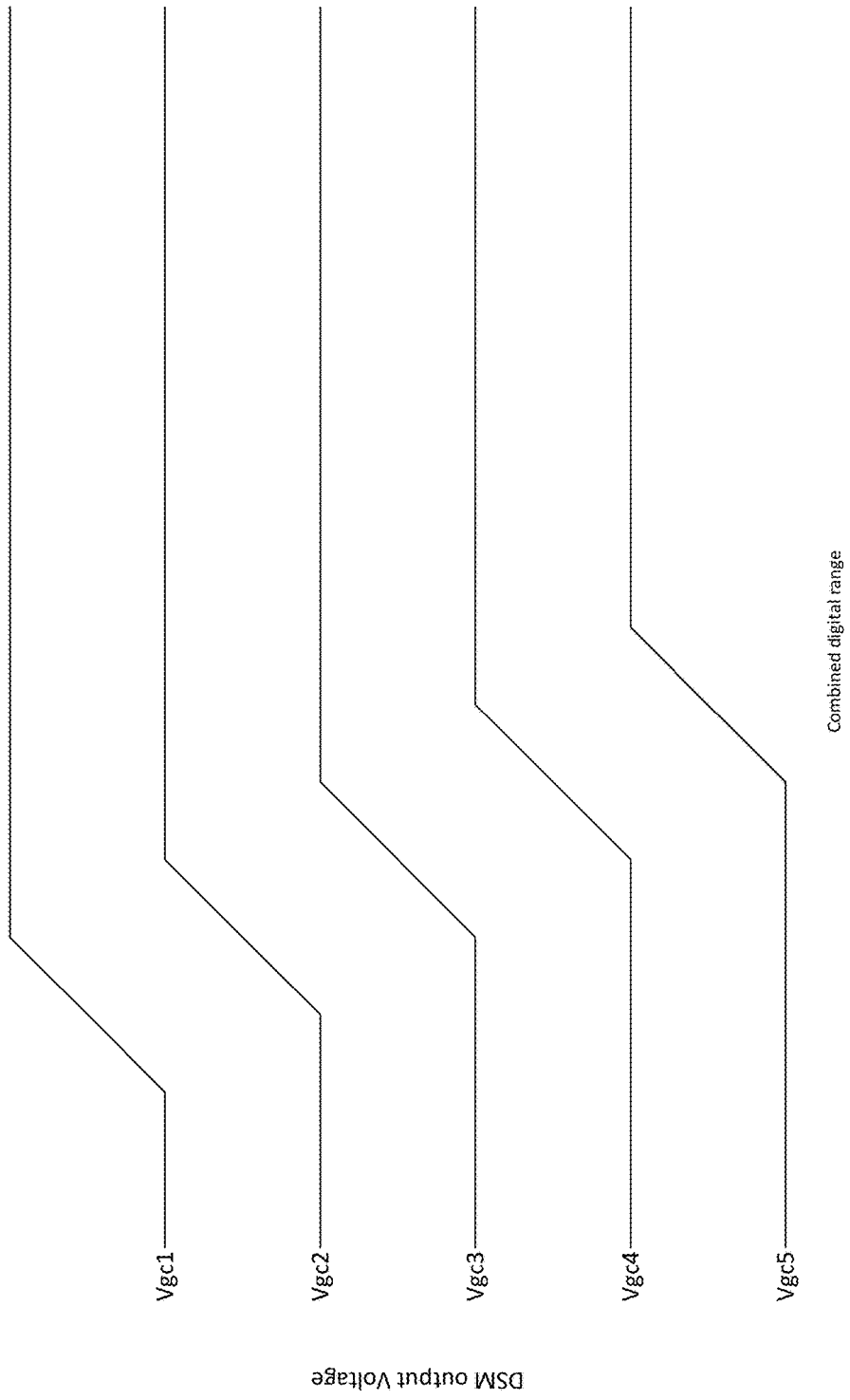
FIG. 10 is a graph illustrating combined gain digital code range for multiple tuning sections and corresponding control signals generated by DACs according to embodiments of the present invention.

FIG. 10 is a graph illustrating combined gain digital code range for multiple tuning sections and corresponding control signals generated by DACs according to embodiments of the present invention. This diagram is merely an example, which should not unduly limit the scope of the claims. One of ordinary skill in the art would recognize many variations, alternatives, and modifications. For FIG. 10, horizontal axis corresponds to combined digital range, and the vertical axis corresponds to DSM output voltages. For example, "Vgc1" signal is for a tuning section with at the lowest digital code setting, and it starts ramping up and reaches it maximum value before other tuning sections. "Vgc12" signal is for a tuning section that has a higher digital setting (e.g., higher gain tuning section), and it starts ramping up after the "Vgc11" signal started ramping up, but before the "Vgc1" signal reaches the maximum value. It is to be noted that is an overlapping ramping regime shared between the "Vgc1" signal and the "Vgc2" signal, which allows the output to be continuous. Similarly, signals "Vgc3", "Vgc4", and "Vgc5" cascade in a similar fashion, thereby allowing a large tuning range.

It is to be appreciated the VGAs according to embodiments of the present invention have a wide range of applications. For example, VGA can be used in communication, modulation, audio compression, and many other systems.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A system comprising:
   a variable gain amplifier (VGA) device comprising:
   a first input transistor comprising a first terminal and a second terminal and a third terminal, the first input transistor being configured to receive a first input voltage at the first terminal;
   a second input transistor comprising a fourth terminal and a fifth terminal and a sixth terminal, the second input transistor being configured to receive a second input voltage at the fourth terminal;
   a first load being coupled to the second terminal and a first output terminal;
   a second load being coupled to the fifth terminal and a second output terminal;
   a control module being configured to generate a first tuning signal and a second tuning signal, the second tuning signal being at a low-gain setting if a gain setting for the VGA is lower than a first predetermined threshold value;
   a first tuning section comprising a first resistor and a first tuning transistor, the first tuning transistor being coupled to the first tuning signal, the first tuning section being coupled to the third terminal and the sixth terminal; and
   a second tuning section comprising a second tuning transistor, the second tuning section being coupled to the second tuning signal, the second tuning section being coupled to the third terminal and the sixth terminal;

wherein the first tuning signal changes an impedance value of the first tuning transistor, the impedance value of the first tuning transistor being predetermined; and
an interface coupled to the first input transistor and coupled to the second input transistor.

2. The device of claim 1 wherein the first tuning signal and the second tuning signal are both active if the gain setting for the VGA is higher than the first predetermined threshold value.

3. The device of claim 1 wherein the control module receives the gain setting signal from an external device.

4. The device of claim 1 wherein the first tuning and the second tuning sections are configured in parallel.

5. The device of claim 1 wherein the first input transistor comprises a MOSFET device.

6. The device of claim 1 wherein a gain of the VGA substantially is proportional to a transconductance value.

7. The device of claim 1 wherein the first load comprises a load transistor.

8. The device of claim 1 wherein the first load comprises a load resistor.

9. The device of claim 1 wherein the first tuning signal indicates an "on" or "off" state for the first tuning transistor.

10. The device of claim 1 further comprising a third tuning section.

11. The device of claim 1 wherein the control module comprises a state machine for generating the first tuning signal and the second tuning signal.

12. The device of claim 1 further comprising a first digital-to-analog converter (DAC) configured to generate the first tuning signal based on a DAC code.

13. A method for operating a variable-gain amplifier in a system, the method comprising:
in the system:
receiving an input gain signal;
determining a first gain control value based on the input gain signal;
determining a second gain control value, the second gain control value being at a high-gain setting if the input gain signal is greater than a threshold level;
converting the first gain control value to a first gain control signal, the first gain control value including a DAC code, the first gain control signal including an analog tuning voltage;
generating a first gain control signal based on the first gain control value;
generating a second gain control signal based on the second gain control value;
receiving a first input signal and a second input signal;
providing a first tuning section including a first transistor and a first resistor;
providing a second tuning section including a second transistor;
adjusting a first impedance value of the first tuning section using the first gain control signal;
adjusting a second impedance value of the second tuning section using the second gain control signal; and
providing a first output signal, the first output signal being characterized by a gain level associated with the input gain signal, the first output signal being based at least on the first impedance value and the second impedance value; and
using the first output signal.

14. The method of claim 13 wherein first gain control signal indicates a high-gain setting or a low-gain setting for the first transistor.

15. The method of claim 13 wherein first gain control signal adjusts an impedance value of the first transistor.

16. The method of claim 13 further comprising generating a third gain control signal for a third tuning section, the third tuning section comprising a transistor and/or a switch element.

17. The method of claim 13 further comprising measuring the first tuning section and second tuning section to determine the threshold level, wherein the first gain control value is at a maximum value when the second gain control value is active.

18. An electrical system for adjusting signal gain, the system comprising:
an amplifier circuit comprising:
a first input transistor comprising a first terminal and a second terminal and a third terminal, the first input transistor being configured to receive a first input voltage at the first terminal;
a second input transistor comprising a fourth terminal and a fifth terminal and a sixth terminal, the second input transistor being configured to receive a second input voltage at the fourth terminal;
a first load being coupled to the fourth terminal and a first output terminal;
a second load being coupled to the fifth terminal and a second output terminal;
a control module being configured to generate a first tuning signal and a second tuning signal, the second tuning signal being at a low-gain setting if a gain setting for the VGA is lower than a first predetermined threshold value;
a first tuning section comprising a first resistor and a first tuning transistor, the first tuning transistor being coupled to the first tuning signal, the first tuning section being coupled to the third terminal and the sixth terminal; and
a second tuning section comprising a second tuning transistor, the second tuning section being coupled to the second tuning signal, the second tuning section being coupled to the third terminal and the sixth terminal;
wherein the first tuning signal changes an impedance value of the first tuning transistor, the impedance value of the first tuning transistor being predetermined; and
an interface.

* * * * *